(12) United States Patent
Cherukupalli et al.

(10) Patent No.: US 7,392,495 B1
(45) Date of Patent: Jun. 24, 2008

(54) METHOD AND SYSTEM FOR PROVIDING HYBRID CLOCK DISTRIBUTION

(75) Inventors: Nagendra Cherukupalli, Cupertino, CA (US); Rakesh Mehrotra, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 1236 days.

(21) Appl. No.: 10/218,504

(22) Filed: Aug. 13, 2002

(51) Int. Cl.
*G06F 17/50* (2006.01)

(52) U.S. Cl. .................. 716/10; 716/8; 716/9; 716/11

(58) Field of Classification Search ............... 716/8–11
See application file for complete search history.

(56) References Cited

U.S. PATENT DOCUMENTS

| | | | | |
|---|---|---|---|---|
| 5,239,215 A | * | 8/1993 | Yamaguchi | 327/292 |
| 5,691,662 A | * | 11/1997 | Soboleski et al. | 327/292 |
| 5,783,960 A | | 7/1998 | Lackey | 327/295 |
| 5,912,820 A | * | 6/1999 | Kerzman et al. | 716/6 |
| 6,006,025 A | * | 12/1999 | Cook et al. | 716/14 |
| 6,204,713 B1 | * | 3/2001 | Adams et al. | 327/295 |
| 6,205,571 B1 | * | 3/2001 | Camporese et al. | 716/2 |
| 6,223,329 B1 | * | 4/2001 | Ling et al. | 716/7 |
| 6,298,468 B1 | * | 10/2001 | Zhen | 716/2 |
| 6,339,235 B1 | | 1/2002 | Takata | 257/208 |
| 6,351,840 B1 | | 2/2002 | Teng | 716/7 |
| 6,378,080 B1 | * | 4/2002 | Anjo et al. | 713/500 |
| 6,467,074 B1 | * | 10/2002 | Katsioulas et al. | 716/17 |
| 6,539,509 B1 | * | 3/2003 | Teene | 714/727 |
| 2001/0011362 A1 | * | 8/2001 | Yoshinaga | 716/8 |
| 2002/0087939 A1 | * | 7/2002 | Greidinger et al. | 716/2 |

* cited by examiner

*Primary Examiner*—Jack Chiang
*Assistant Examiner*—Naum B Levin

(57) ABSTRACT

A method and system for providing hybrid clock distribution is disclosed. The distribution architecture uses a grid distribution at the top level and a balanced buffer tree distribution at the block level. The method includes determining the block layout of an integrated circuit which employs a clock distribution network for distributing clock signals. In addition the method includes providing a mesh distribution network for delivering clock signals to integrated circuit blocks of the integrated circuit. Thereafter, a balanced tree distribution network for delivering clock signals to the components of each block of the integrated circuit is provided. The top level grid provides predictable min/max skew at the top level and the remainder skew budget can be applied to the blocks.

20 Claims, 9 Drawing Sheets

METHOD AND SYSTEM FOR PROVIDING HYBRID CLOCK DISTRIBUTION

TECHNICAL FIELD

Embodiments of the present invention relate generally to clock distribution networks. In particular, an embodiment of the present invention relates to a method and system for providing a hybrid clock distribution network.

BACKGROUND ART

Clock distribution network designers face the problem of designing clock distribution networks that distribute clock signals throughout an integrated circuit device or system with a minimal level of clock skew. Clock skew is the difference in arrival times of clock edges to different parts of a system. Synchronous digital logic requires a precision synchronization of clock signals for the latching of data. Ideal synchronous logic relies on the simultaneous arrival of clock signals to all circuits located in the system. Clock skew affects distribution network design by reducing the maximum operating frequency that is attainable by a system. This is because the system has to be designed taking worst case skew into account for it to operate reliably.

The principle cause of clock skew in clock distribution networks is the variation in the routing impedance of various branches of the clock distribution network. Consequently, clock skew may arise within an individual integrated circuit die even where an equal length clock distribution network such as an H-Tree is employed. As a result, a skew budget derived from a worst case skew analysis must be adhered to by network designers in order for the circuits supplied by the network to operate reliably. A good rule of thumb is that the clock skew budget may not exceed approximately 10% of the cycle time. Hence for a 1 GHz clock frequency, which corresponds to a 1 ns cycle time, the tolerable clock skew may be less than or equal to 100 ps. If skew increases beyond a certain time period, setup and hold time problems may be unavoidable. It should be appreciated, however, that as VLSI clock frequencies increase beyond 1 GHz, the distribution network design constraints presented by clock skew become even more challenging.

Auto routing tools may be used to build balanced buffer trees for clocks based on operator provided constraints. However, as circuit components (flip flops etc.) increase it becomes more difficult at the block level for the auto routing tool to provide a buffer tree that balances clock skew. Building chip level buffer trees using auto routing tools become more difficult as the number of blocks in a design increase. The process is further complicated by the need to have provided a timing number for each of the blocks in a design. As the design size increases to levels that encompass millions of gates, the clock skew exhibited by a network may increase prohibitively. Within a single block clock skew may be manageable, but may become increasingly difficult as the designer progresses to the chip level. Moreover, as systems become more complicated utilizing increasingly faster operating frequencies, it becomes extremely difficult to resolve clock skew problems at the chip level (e.g., using the balanced buffer tree approach) without substantial manual input.

Generally, there are two basic distribution schemes that are currently in common use. The first employs balanced buffer tree networks at both the block and chip levels of an integrated circuit design such as is shown in FIG. 1. FIG. 1 shows clock pin 101, individual integrated circuit blocks 103, integrated circuit 105, block level buffer tree network 107, and chip level buffer tree network 109. According to this approach, the clock inputs to the individual blocks 103 of the integrated circuit are treated as leaf pins of the chip level buffer tree network 109. A drawback of this approach includes the difficulty in achieving a balanced skew across the blocks of the integrated circuit 105 at the chip level. This is a consequence of the difficulty posed in predicting the routing characteristics of the routes traversed by clock signals (input at clock pin 101) that are transmitted through the clock distribution network. In addition, according to this methodology, the top level clock plan cannot be designed until each block level buffer tree network 107 inside the integrated circuit blocks 103 are placed and routed.

The second conventional clock distribution scheme employs a flat clock mesh network for distributing clock signals to all the circuit components in a chip. Using this method, grid meshes are used to connect each component within a block. Skew for each component may then be ascertained (predicted) and utilized in arranging a network of buffers at the periphery of the block to adjust the delays for each component (care should be taken that the introduction of delay buffers do not introduce too much delay). However, because the delay of each component in the system must be managed, systems that employ millions of components require extensive manual layout work. Additional drawbacks of this scheme include its lack of hierarchical intricacy, its routing track intensiveness, the long turn around times manifest in its production, and the lack of tool support available for creation and analysis purposes. It should be appreciated that, skew prediction at the chip level is very difficult with either of these schemes, and accommodating multiple clock domains may present significant challenges.

SUMMARY OF THE INVENTION

Accordingly, a need exists for a method and system that utilizes a hybrid clock distribution approach to balancing clock skew. The present invention provides a method and system which accomplishes the above mentioned need. Generally, the present invention provides a top down approach to clock skew balancing that allows predictability to min/max skew. Moreover, the present invention allows skew balancing more appropriately for the blocks.

For instance, one embodiment of the present invention provides a method and system for providing a hybrid clock distribution network to balance a clock skew in an integrated circuit. The method includes determining the block layout of an integrated circuit that employs a clock distribution network for distributing clock signals. Next, a clock insertion point for each block is determined. In addition, the method includes providing a top level mesh distribution network for delivering clock signals to the laid out integrated circuit blocks of the integrated circuit at selected clock insertion points. Top level skew is then computed. Thereafter, a balanced tree distribution network is used for delivering clock signals to the components of each block of the integrated circuit. At this point, the remainder of the skew budget that was not allocated to the top level skew may be used at the block level in the implementation of the block level balanced tree.

In one embodiment, the method and system provides for receiving a clock signal into a mesh distribution network. The clock edges of the clock signal are thereafter balanced with chip level buffers placed on the periphery of the mesh distribution network. The balanced clock edges are distributed to the integrated circuit blocks and received into a balanced tree clock distribution network. Within each block, the clock edges are balanced with block level buffers located in the balanced tree clock distribution network, and distributed to cells of the integrated circuit block.

In yet another embodiment, the present invention includes a computer-usable medium having computer-readable code embodied therein for causing a computer to perform particular actions as described above which enable hybrid clock distribution.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Figure 1:
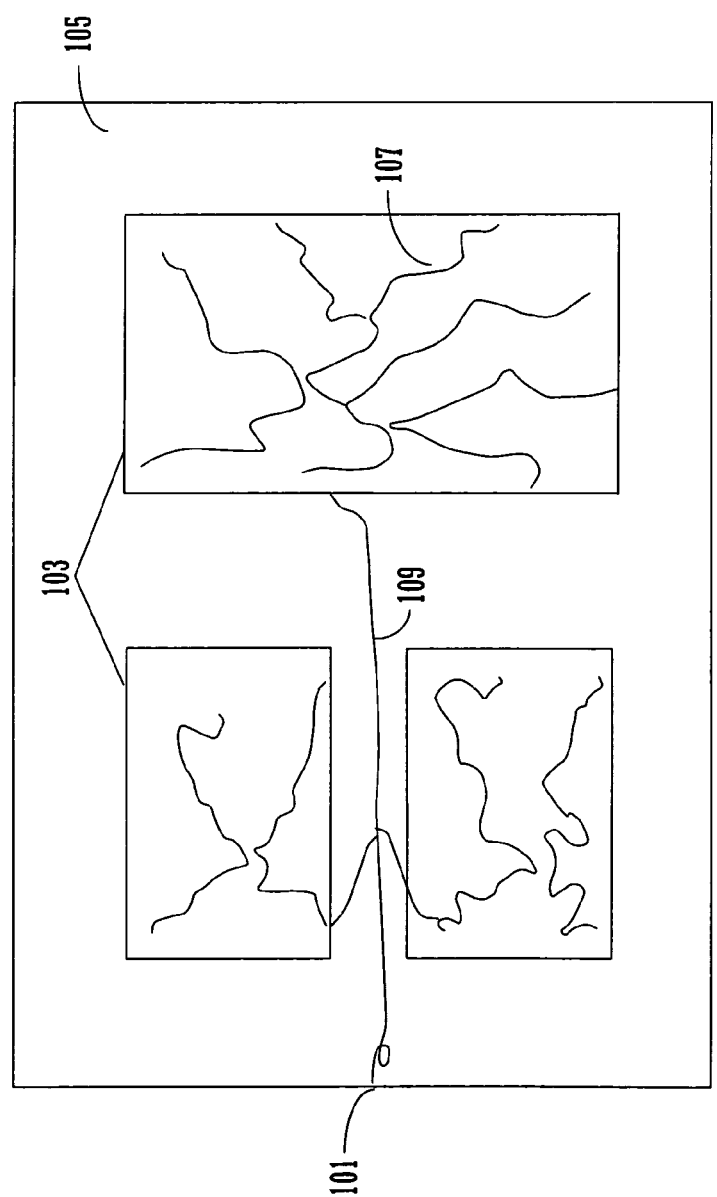
FIG. 1 shows a conventional clock distribution network which employs balanced tree schemes at both the top and block levels of the integrated circuit.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

NOTATION AND NOMENCLATURE

Some portions of the detailed descriptions which follow are presented in terms of procedures, logic blocks, processing, and other symbolic representations of operations on data bits within a computer system or electronic computing device. These descriptions and representations are the means used by those skilled in the data processing arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic or optical signals capable of being stored, transferred, combined, compared, and otherwise manipulated in a computer system or similar electronic computing device. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussions, it is understood that throughout discussions of the present invention, discussions utilizing terms such as "providing" or "receiving" or "determining" or the like, refer to the action and processes of a computer system, or similar electronic computing device, that manipulates and transforms data. For example, the data is represented as physical (electronic) quantities within the computer system's registers and memories and is transformed into other data similarly represented as physical quantities within the computer system memories or registers or other such information storage, transmission, or display devices.

EXEMPLARY NETWORK IN ACCORDANCE WITH EMBODIMENTS OF THE PRESENT INVENTION

Figure 2:
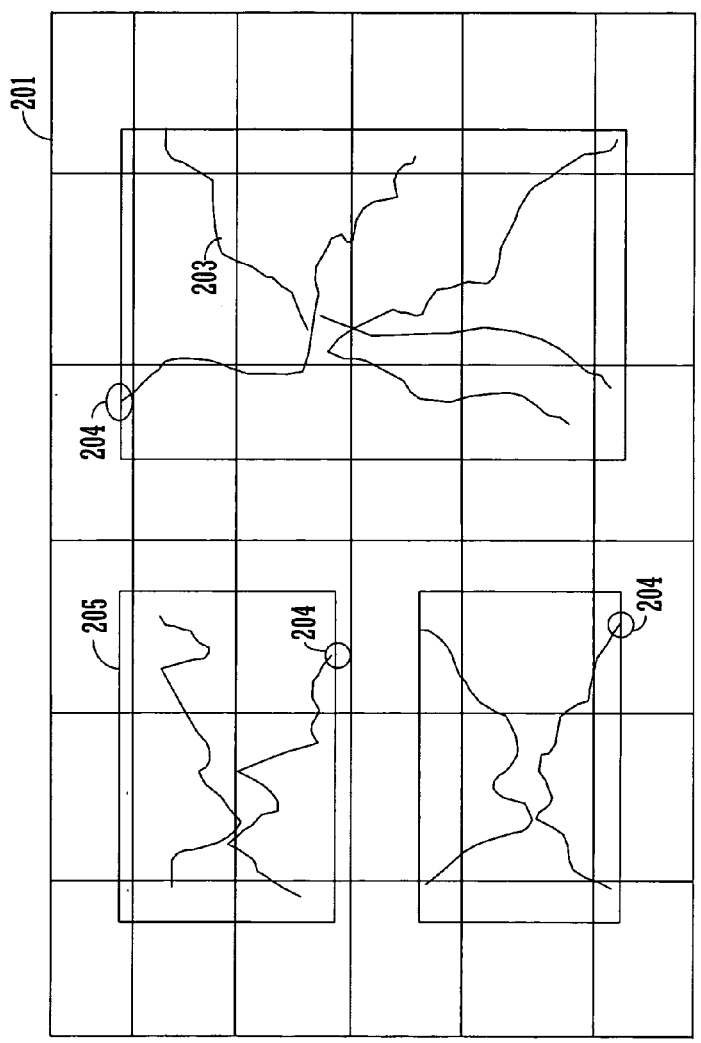
FIG. 2 shows a hybrid clock distribution network that employs both mesh and balanced tree components according to one embodiment of the present invention.

FIG. 2 shows a hybrid clock distribution network 200 that employs both top level mesh and block level balanced tree components according to one embodiment of the present invention. In the embodiment shown, an integrated circuit comprises both block and chip or "top" level components. According to exemplary embodiments of the present invention, a grid clock distribution network may be utilized to distribute clock signals to chip level components while a balanced tree distribution network may be utilized to distribute clock signals to block level components. The methodology employed in putting these distribution networks into place provides data that establishes the skew budgetary constraints that are to be observed at the block and chip levels. This data facilitates an optimal utilization of buffers for the purpose of clock signal balancing in a clock distribution network at both the chip and block levels of a proposed integrated circuit design. In particular, FIG. 2 shows top level clock distribution grid 201, block level clock distribution tree 203, clock pins 204 and integrated circuit blocks 205.

As described in the following discussion, this approach constitutes a top down clock distribution methodology that provides predictability of min and max clock skew at the top level. This system also provides skew balancing using balanced trees at the block level, which is a more appropriate balancing solution at this level.

Clock distribution grid 201 or "mesh" delivers clock signals to individual blocks (e.g., 205) of the integrated circuit via clock pins 204. Grid lines of a mesh network carry these signals to the individual blocks of the integrated circuit. Clock signals transmitted through the clock distribution grid 201 may become skewed as a result of the differences in the propagation characteristics (routing lengths, routing impedances, etc.) of network branches. These skewed clock signals may be balanced by the use of delay buffers within the mesh and associated with the periphery of the top level circuit layout in order for an integrated circuit receiving these signals to operate reliably.

Moreover, clock distribution tree 203 delivers clock signals to individual cells within the integrated circuit blocks. As with clock distribution grid 201, clock signals of a balanced tree clock distribution network may become skewed as a result of the differences in the propagation characteristics (e.g., routing lengths, etc.) of network branches. As previously mentioned, these skewed clock signals must be balanced within tolerance in order for the integrated circuit receiving theses signals to operate reliably.

Integrated circuit blocks 205 receive clock signals via clock distribution grid 201 at predetermined clock insertion points 204. Clock signals are delivered to circuit components located inside of the blocks via clock distribution tree 203. Clock skew may be exhibited at both the chip and block levels. Therefore, a clock distribution network that balances skew at both levels is required.

As shown in FIG. 2, embodiments of the present invention employ a combination of both top level mesh and block level tree clock distribution network schemes. Exemplary embodiments thus advantageously present a hybrid approach to managing clock distribution network clock skew. It should be appreciated that the skew of clock signals in a clock tree network is difficult to predict until a completed clock tree has been implemented. However, when this point is reached it is generally too late in the design cycle for correcting (tweaking) incorrect planning made earlier in the process. Conversely, embodiments of the present invention allow up front planning and up front budgeting of skews by use of a top level mesh approach. This approach allows clock distribution network planning regarding network components located at the highest level of design abstraction to be completed early in the design cycle.

Figure 5:
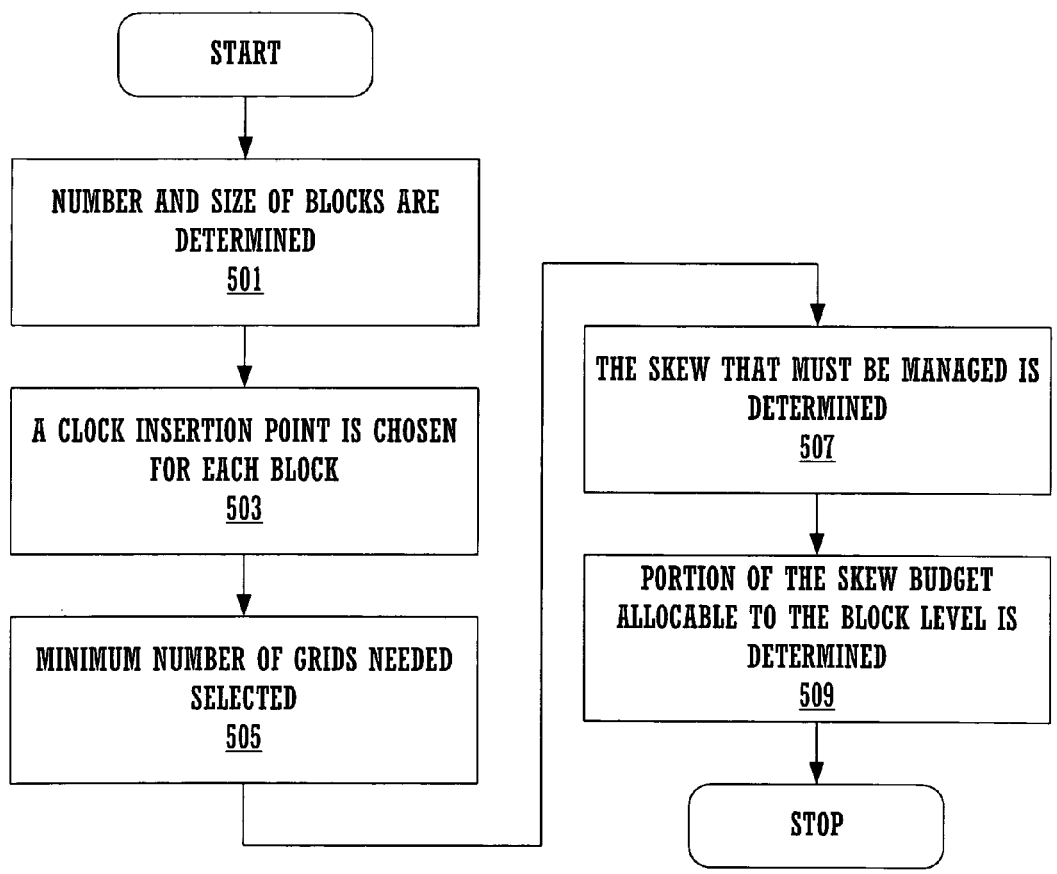
FIG. 5 shows flowchart of steps performed in ascertaining the amount of skew to be managed at the top and block levels of an integrated circuit in accordance with one embodiment of the present invention for providing an hybrid clock distribution.

By employing a grid at the chip or top level, the best and worst case skew exhibited at that level (e.g., at the insertion points to the blocks) can be predicted (see discussion made with reference to FIG. 5). Consequently, clock tree buffer insertion at the block level may be executed much more effectively using the balance of the unallocated skew budget. For example, if a chip has a total skew budget of 500 pico seconds and 200 pico seconds of skew must be managed at the top level, it may be easily determined that 300 pico seconds of the original skew budget is left remaining that may be allocated to block level components. Thus, a designer is able to design to a set of known constraints instead of proceeding blindly or uninformed. Using this approach, skew balancing may be executed more appropriately both at the chip level and inside of the integrated circuit blocks.

According to exemplary embodiments, chip design tool support may be utilized to facilitate the implementation of the mesh network at the chip level. Once parameters such as grid spacing (microns, mils, etc.), grid thickness (microns, mils, etc.), and spacing along the horizontal axis (microns, mils, etc.) are determined by a user/operator, the mesh implementing process may be automated by programming a planning tool to generate a mesh corresponding to a provided parameter set.

Figure 3A:
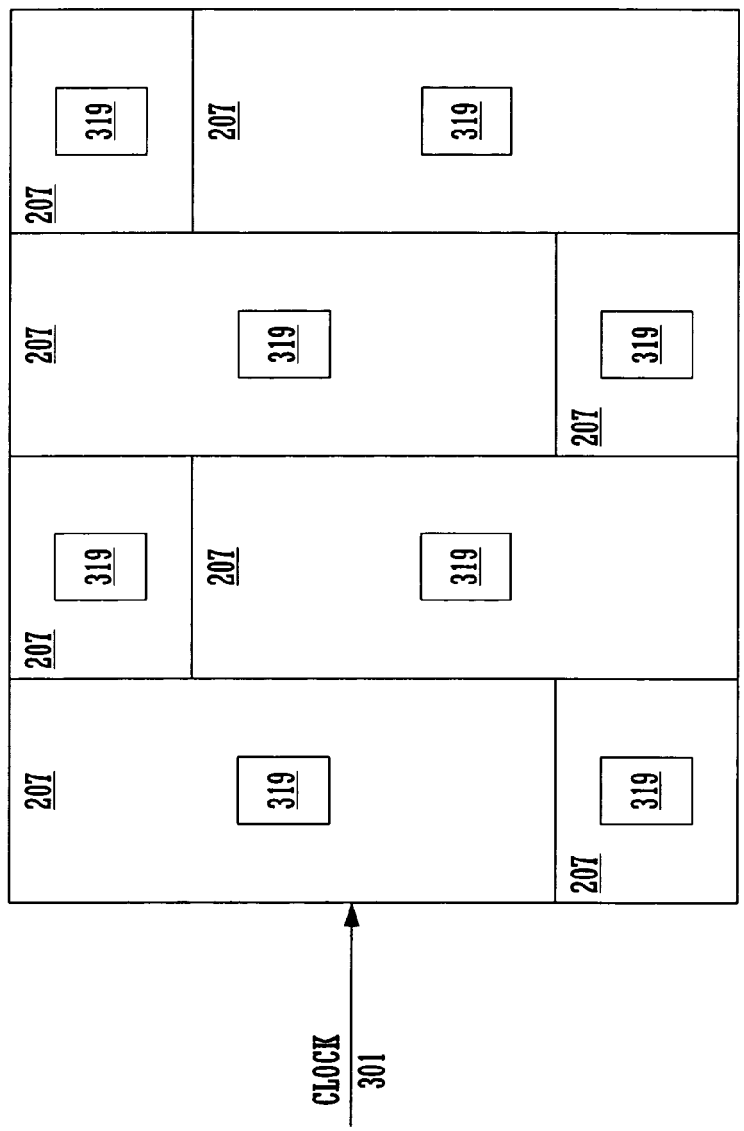
FIG. 3A illustrates an integrated circuit partitioning arrangement according to one embodiment of the present invention.

FIG. 3A illustrates an integrated circuit partitioning arrangement according to one embodiment of the present invention. Initially, according to exemplary embodiments, the number, size and layout (e.g., position) of the blocks that are to be used in the design are determined. It should be appreciated that the blocks may be derived from the well known technique of partitioning of an integrated circuit design into smaller parts. It should be appreciated that the blocks may contain circuit building block components such as logic gates and flip flops (e.g. 319). According to exemplary embodiments, the blocks may contain upwards of a million logic gates but could contain any number of gates. According to one embodiment at least 10% of the integrated circuit components located in the blocks may be flip flops but could be any logic element. FIG. 3A shows clock signal 301, integrated circuit blocks 207, and components 319.

According to exemplary embodiments of the present invention, the clock signal 301 may be distributed to integrated circuit blocks and components via a hybrid mesh and balanced tree distribution network (e.g., 200, FIG. 2). According to such embodiments, clock distribution grid (e.g., 201, FIG. 2) delivers a clock signal 301 to insertion points of individual blocks of the integrated circuit, while clock distribution tree (e.g., 203, FIG. 2) delivers clock signals to individual components 319 such as flip flops located within the integrated circuit blocks 207.

Integrated circuit blocks 207 may receive clock signals 301 via clock distribution grid 201. According to exemplary embodiments, the skew that may be exhibited by these clock signals can be managed using processes described herein. The methodology employed includes identifying the feeders that are closest to the best and worst performing clock pins fed by the grid network, and by ascertaining the amount of time needed for a clock signal to travel the distances along the feeders to each of these pins. Through these processes a measure of the best and worst case skews exhibited at the chip level may be computed. The difference between these two measurements constitutes a calculation of the skew needed to be managed at the top level. Using this calculation an appropriate balancing of the clock signal may be performed.

Figure 3B:
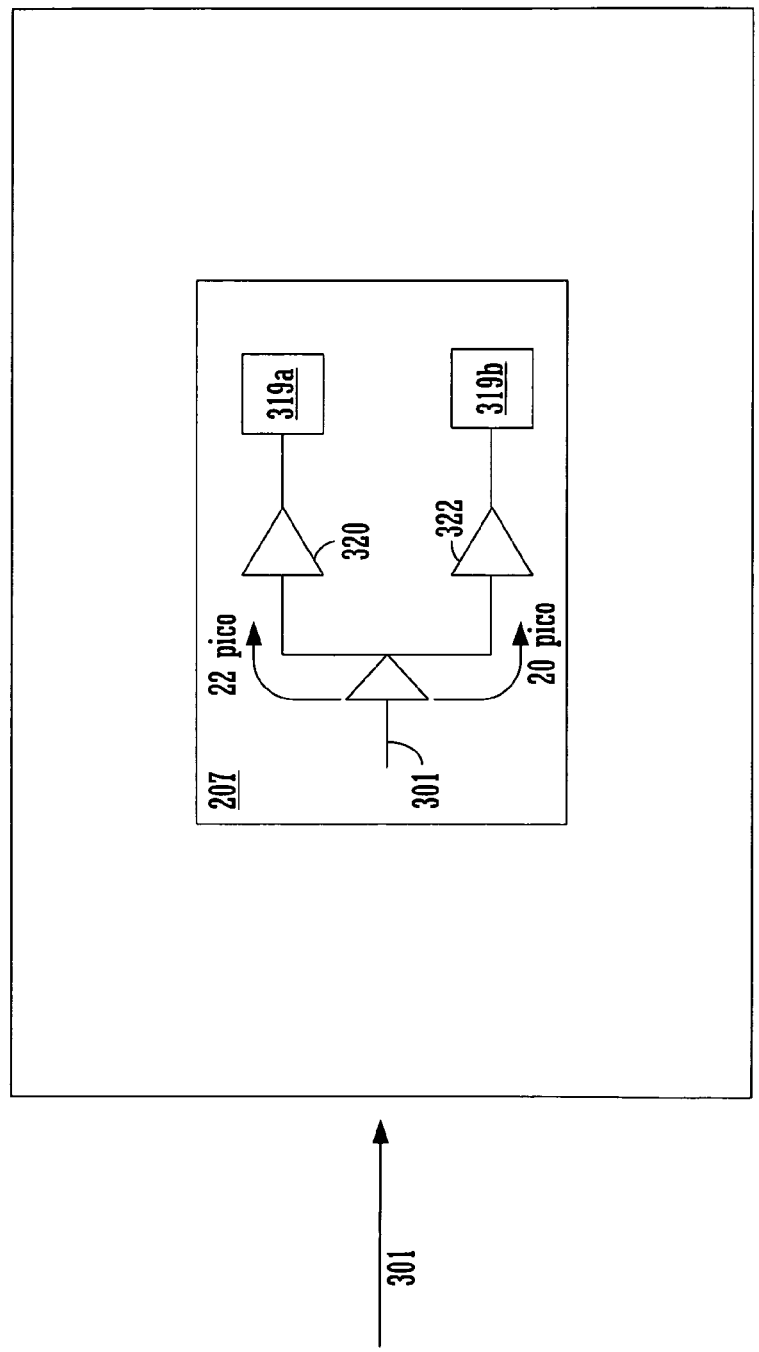
FIG. 3B illustrates a block balancing scheme according to one embodiment of the present invention.

FIG. 3B illustrates a block level skew balancing scheme according to one embodiment of the present invention using a balanced tree at the block level. According to exemplary embodiments of the present invention, a clock signal may be balanced by managing the routing length traveled by clock signal edges to each component (e.g., flip flop, etc.) in the integrated circuit to which they are delivered. This may be accomplished by managing the skew of the clock edges at both the chip and block levels. According to such embodiments buffers may be inserted into the signal lines (at both the chip and block levels) at appropriate locations so that a transmitted clock edge reaches each component within the skew tolerance. By thus managing the skew, setup and hold time problems may be avoided. FIG. 3B shows integrated circuit block 207, clock 301, buffers 320 and 322 and flip flops 319a and 319b. The buffers 320 and 322 and the routing resources connecting them comprise a buffer tree.

Referring to FIG. 3B, buffers 320 and 322 are chosen so as to manage the arrival of clock edges transmitted from clock 301 to flip flops 319a and 319b. The size and location of the buffers are chosen so as to eliminate the skew between edges arriving at the different flip flops. The size and location of these buffers may be chosen based on information provided by a skew budget determining methodology described herein with reference to FIG. 5. This methodology employs a mesh distribution scheme at the top level and a balanced buffer tree distribution scheme at the block level. By managing the routing lengths and thus the skew of clock signals exhibited at both the chip and block levels, setup and hold time problems may be avoided as previously mentioned. In the example shown in FIG. 3B, a clock signal 301 is transmitted to flip flops 319a and 319b located within integrated circuit block 207. A balanced tree methodology is employed to manage the routing lengths of clock signals distributed inside of the block. This facilitates the simultaneous arrival of clock signal edges skewed by 2 pico seconds (e.g., 22 pico seconds–20 pico seconds=2 picoseconds, see FIG. 3B) at the terminals of flip flops 319a and 319b. According to exemplary embodiments, this may be accomplished by appropriately choosing the buffers 320 and 322 in the balanced tree arrangement.

Figure 3C:
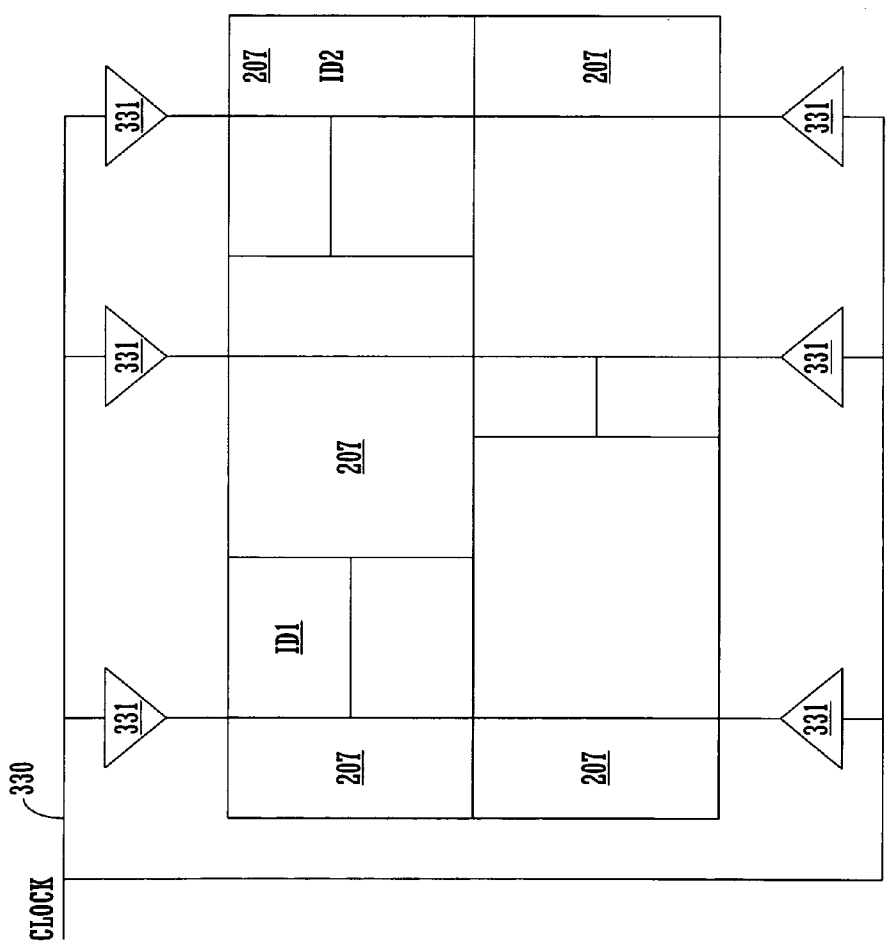
FIG. 3C illustrates a grid distribution structure for distributing clock signals to the various blocks of an integrated circuit according to one embodiment of the present invention.

FIG. 3C illustrates a top level grid distribution structure for distributing clock signals to the various blocks of an integrated circuit according to one embodiment of the present invention. According to exemplary embodiments, a clock insertion point is chosen for each block in the design. The clock insertion point may be found by considering the dimensions of the block. According to such embodiments, the minimum number of grids needed to distribute the clock signal to the blocks may be selected. This number corresponds to the number of blocks and corresponding clock pins requiring clock signals. The grid network that is employed may distribute the clock signal to various blocks of the integrated circuit structure. FIG. 3C shows clock distribution grid 330, integrated circuit blocks 207, and top level buffers 331.

Clock distribution grid 330 delivers a clock signal to the various blocks 207 of the integrated circuit. Because skew may be exhibited between the blocks, the clock skew needed to be managed at the top level can be determined in advance of the design of the blocks. This can be accomplished by determining the best case and worst case clock skew that may be generated at the top level. It should be appreciated that by identifying the feeders that are closest to the best and worst performing clock pins, and by ascertaining the amount of time needed for a clock signal to travel the distances to each of these pins, a measure of the best and worst case skews may be computed at each insertion point. The difference between these two measurements constitutes a calculation of the skew needed to be managed at the top level (see discussion below) for each insertion point.

Top level buffers 331 are chosen so as to manage the arrival of clock edges transmitted from a clock (e.g., 301) to the various blocks of the integrated circuit. The size and location (along the periphery of the mesh network) of the buffers are chosen so as to reduce the skew between clock edges arriving at the different blocks. The clock delay seen at the individual blocks is termed insertion delay. In FIG. 3C, the insertion delay $ID_1$ represents the insertion delay corresponding to the best case skew seen at the chip level among all blocks while insertion delay $ID_2$ represents the insertion delay corresponding to the worst case skew seen at the chip level among all blocks. Therefore, the skew that must be managed at the chip level may be determined using the equation:

$$\text{Skew}_{Chip\ Level} = ID_2 - ID_1.$$

Accordingly, if for example the total skew allowable for the entire integrated circuit network is equal to 500 pico seconds, and assuming the skew at the top level is 200 pico seconds, then the skew allocable to the blocks would be 300 pico seconds. The skew allocable to the blocks may be determined using the equation:

$$\text{Skew}_{Block\ Level} = \text{Total Skew Budget} - \text{Skew}_{Chip\ Level}.$$

Being able to predict the allowable skew at the chip and the block levels in this manner allows an informed design of the clock distribution network including a more appropriate insertion of delay buffers at the chip level and a more appropriate balancing of the tree network at the block level. The skew at the top level can be determined by merely knowing the block layout, size and insertion point without knowing the internal design of the block. Therefore, this top level approach can be performed before the blocks themselves have been designed.

EXEMPLARY OPERATIONS IN ACCORDANCE WITH EMBODIMENTS OF THE PRESENT INVENTION

Figure 4:
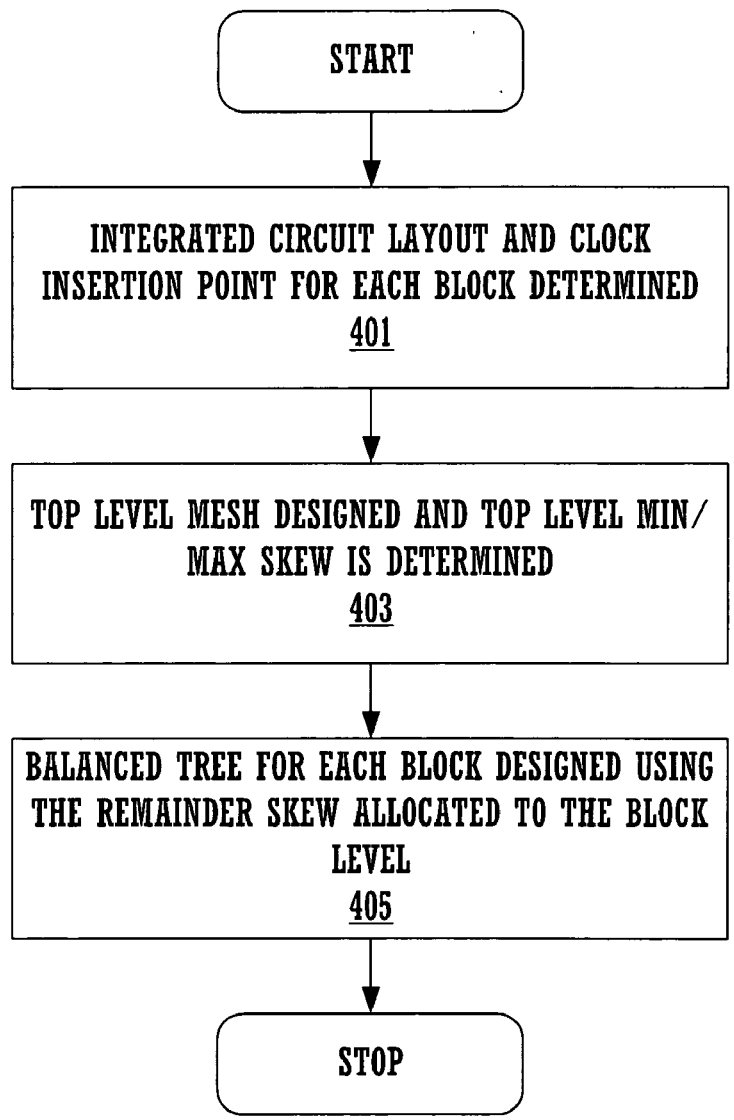
FIG. 4 shows a flowchart of steps performed in accordance with one embodiment of the present invention for providing an hybrid clock distribution.

FIGS. 4 and 5 show flowcharts 400 and 500 of steps performed in accordance with one embodiment of the present invention for providing hybrid clock distribution. Flowchart 400 and 500 include processes of the present invention which, in one embodiment, may be carried out by processors and electrical components under the control of computer readable and computer executable instructions. The computer readable and computer executable instructions reside, for example, in data storage features such as computer usable volatile memory and/or computer usable non-volatile memory (e.g. 704 and 706 described herein with reference to FIG. 7). However, the computer readable and computer executable instructions may reside in any type of computer readable medium. Although specific steps are disclosed in flowcharts 400 and 500, such steps are exemplary. That is, the present invention is well suited to performing various other steps or variations of the steps recited in FIGS. 4 and 5. Within the present embodiment, it should be appreciated that the steps of flowcharts 400 and 500 may be performed by software, by hardware or by any combination of software and hardware.

At step 401 of FIG. 4, the integrated circuit layout is determined. According to exemplary embodiments, the number and size of the circuit blocks that may be used in a particular design are determined. The layout of these blocks is also determined (e.g., the top level positions of these blocks are determined). The blocks are derived from the partitioning of an integrated circuit design into smaller parts. It should be appreciated that the blocks may contain building block circuit components such as logic gates and flip flops. According to one embodiment, such blocks may contain various numbers of logic gates. A clock insertion point is chosen for each block in the design. Additionally, at 401 a clock insertion point may be found by considering the dimensions of the block.

At step 403, a top level mesh network is designed. According to exemplary embodiments, the minimum number of grids needed to distribute the clock signal to the various blocks of the integrated circuit is selected. This number corresponds to the number of blocks and corresponding clock pins that require clock signals. Utilizing the grid structure that is selected, the skew that is to be managed at the top level is determined. This is accomplished by determining the best case and worst case clock skew that may be generated at the top level among blocks. It should be appreciated that by identifying the feeders that are closest to the best and worst performing clock pins (e.g., 204) and by ascertaining the amount of time needed for a clock signal to travel the distances to each of these pins, a measure of the best and worst case skews may be computed. The difference between these two measurements constitutes a representation of the skew needed to be managed at the top level amongst all the blocks.

At step 405, a balanced tree for each block is designed starting from the insertion points. The design is facilitated by determining the portion of the skew budget that is allocable to block level components. The total allowable skew minus the skew that is to be managed at the top level may be allocated to the integrated circuit blocks. This represents the amount of skew that is allowable at the block level. Because the amount of skew that is to be managed at the top level is ascertainable, the amount of skew allocable to the rest of the chip can be determined. This allows up front planning and up front budgeting of skews at the block level and at the top level, and enables network planning regarding network components located at the highest level of design abstraction to be completed early in the design process, e.g., before the block level design is done.

FIG. 5 shows a more detailed flowchart 500 of steps performed in ascertaining the amount of skew to be managed at the chip and block levels of an integrated circuit in accordance with one embodiment of the present invention for providing hybrid clock distribution.

At step 501, the number and size of the blocks that are to be used in the design are determined. The blocks are derived from a partitioning of an integrated circuit design into smaller parts.

At step 503, a clock insertion point is chosen for each block in the design. The clock insertion point may be found by considering the dimensions of the block. According to one embodiment, the position of the clock pin (e.g., 204) is chosen to be a neutral pin position.

At step 505, a minimum number of grid lines needed to distribute the clock signal to the blocks is selected. This number corresponds to the number of blocks and clock pins requiring clock signals. The grid network that is employed may distribute the clock signal to various blocks of the integrated circuit design. Delay buffers at the chip level may be used in distributing the clock signal.

At step 507, the skew that is to be managed at the top level is determined. This is accomplished by determining the best case and worst case clock skew that may be generated at the top level as seen at the block insertion points. It should be appreciated that by identifying the feeders that are closest to the best and worst performing clock pins, and by ascertaining the amount of time needed for a clock signal to travel the distances to each of these pins, a measure of the best and worst case skews may be computed. The difference between these two measurements constitutes a calculation of the skew needed to be managed at the top level.

At step 509, the portion of the skew budget allocable to the block level is determined. The total allowable skew minus the skew that must be managed at the top level (that was determined in step 507) may be allocated to the integrated circuit blocks. This represents the amount of skew that is allowable at the block level. This figure can be provided to the block level designers as a timing constraint. According to embodiments of the present invention, buffer trees are used in each individual block to perform clock distribution in accordance with the skew budget allocated to the blocks in step 509.

Figure 6:
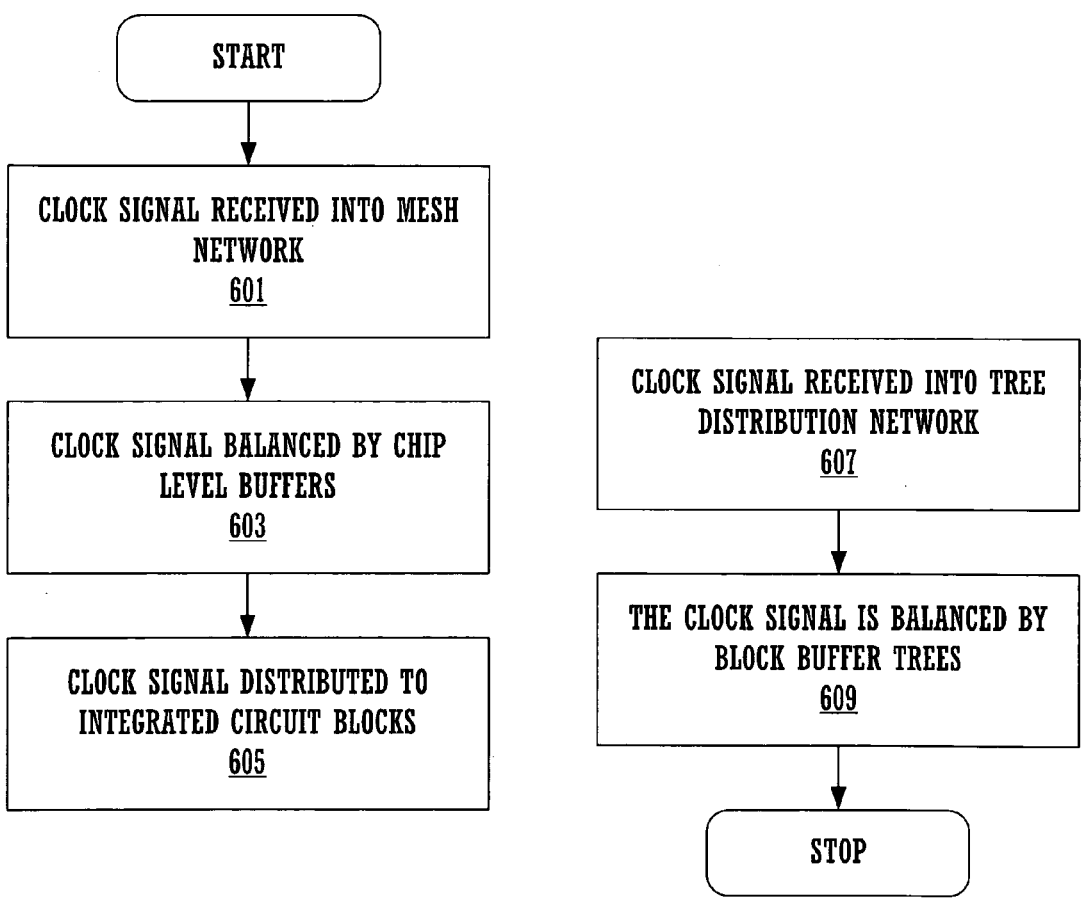
FIG. 6 shows a flowchart of steps performed in distributing a clock signal to an integrated circuit.

FIG. 6 shows a flowchart 600 of steps performed in distributing a clock signal to an integrated circuit. At step 601, a clock signal is received into a chip level mesh distribution network where a clock distribution grid (e.g., 201 FIG. 2) delivers edges of the clock signal to individual blocks of the integrated circuit. Clock signals transmitted through the clock distribution grid (e.g., 201) may become skewed as a result of the differences in the propagation characteristics (routing lengths, routing impedances, etc.) of network branches. These skewed clock signals should be balanced to enable an integrated circuit receiving these signals to operate reliably.

At step 603, the clock signal is balanced by chip level buffers (e.g., 331 FIG. 3C). The buffers 331 are chosen so as to manage the arrival of clock edges transmitted from a clock (e.g., 301) to the insertion points of the blocks of the integrated circuit. The size and location (along the periphery of the mesh network) of the buffers are chosen so as to reduce the skew between clock edges arriving at the different blocks. The clock delay seen at the individual blocks is termed insertion delay (see discussion of insertion delay made with reference to FIG. 3C).

At step 605, the clock signal balanced in step 603 is distributed to the integrated circuit blocks (e.g., 207, FIG. 2). Integrated circuit blocks 207 are delivered clock signals via a clock distribution grid (e.g., 203, FIG. 2). These clock signals are in turn delivered to circuit components located inside of the blocks via a clock distribution tree (e.g., 205, FIG. 2). Clock skew may be exhibited at both the chip and block levels. Therefore, a clock distribution network that balances skew at both levels may be effectuated according to exemplary embodiments.

At step 607, the clock signal distributed to the blocks in step 605 is received into a block level clock tree distribution network. Clock distribution tree 205 delivers clock signals to individual cells within the integrated circuit blocks. As with clock distribution grid 203, clock signals of a balanced tree clock distribution network may become skewed as a result of the differences in the propagation characteristics (routing lengths) of network branches. These skewed clock signals may be balanced in order for an integrated circuit receiving these signals to operate reliably.

At step 609, the clock signal is balanced by block level buffers. This is accomplished by utilizing balanced buffer trees for clock inside of the blocks. Buffers 320 are chosen so as to manage the arrival of a clock edge transmitted from clock 301 to individual cells (e.g., flip flops 319a and 319b). The size and location of the buffers are chosen so as to eliminate the skew between edges arriving at the different cells. The size and location of these buffers may be chosen based on information provided by a methodology described herein with reference to FIG. 5.

EXEMPLARY HARDWARE IN ACCORDANCE WITH EMBODIMENTS OF THE PRESENT INVENTION

Figure 7:
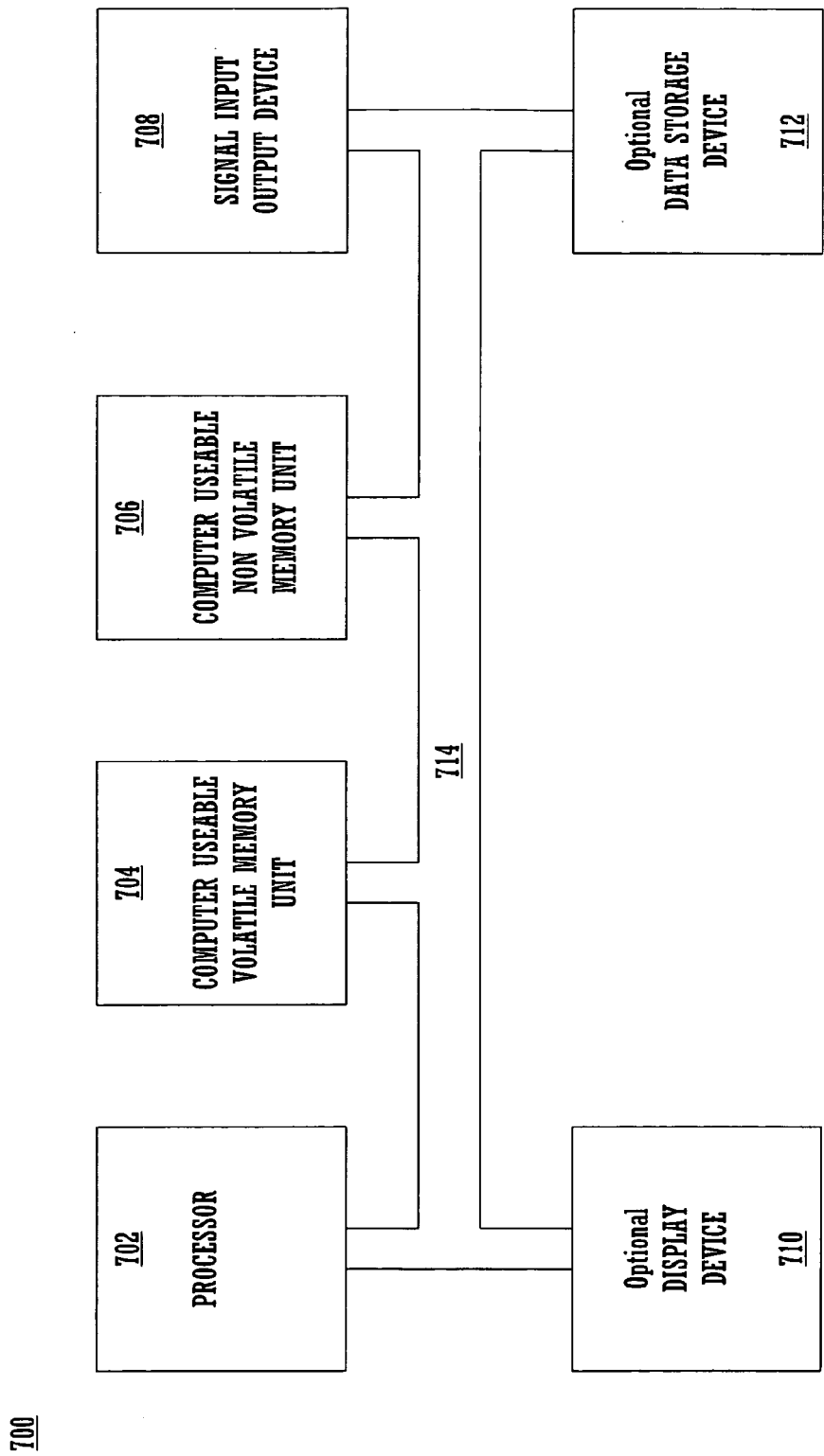
FIG. 7 is a block diagram of an embodiment of an exemplary computer system that may be used in accordance with the present invention.

FIG. 7 is a block diagram of an embodiment of an exemplary computer system 700 used in accordance with the present invention. It should be appreciated that system 700 is not strictly limited to be a computer system. As such, system 700 of the present embodiment is well suited to be any type of computing device (e.g., server computer, portable computing device, etc.). Within the discussions of the present invention, certain processes and steps are discussed that are realized, in one embodiment, as a series of instructions (e.g., software program) that reside within computer readable memory units of computer system 700 and executed by a processor(s) of system 700. When executed, the instructions cause computer 700 to perform specific actions and exhibit specific behavior which is described in detail herein.

For example, the distribution network implementing functionality provided by tool support that is used in providing the distribution networks at both the chip and the block levels as described herein, may be realized as a series of instructions (e.g. software program) that reside within computer readable memory units of a computer system and executed by a processor of the system.

Computer system 700 of FIG. 7 comprises an address/data bus 714 for communicating information, one or more central processors 702 coupled with bus 714 for processing information and instructions. Central processor unit 702 may be a microprocessor or any other type of processor. The computer 700 also includes data storage features such as a computer usable volatile memory unit 704 (e.g., random access memory, static RAM, dynamic RAM, etc.) coupled with bus 714 for storing information and instructions for central processor(s) 702, a computer usable non-volatile memory unit 706 (e.g., read only memory, programmable ROM, flash memory, EPROM, EEPROM, etc.) coupled with bus 714 for storing static information and instructions for processor(s) 702. System 700 also includes one or more signal generating and receiving devices 708 coupled with bus 714 for enabling system 700 to interface with other electronic devices. The communication interface(s) 708 of the present embodiment may include wired and/or wireless communication technology. For example, in one embodiment of the present invention, the communication interface 708 is a serial communication port, but could also alternatively be any of a number of well known communication standards and protocols, e.g., Universal Serial Bus (USB), Ethernet, FireWire (IEEE 1394), parallel, small computer system interface (SCSI), infrared (IR) communication, Bluetooth wireless communication, broadband, and the like.

The system 700 can also includes a computer usable mass data storage device 712 such as a magnetic or optical disk and disk drive (e.g., hard drive or floppy diskette) coupled with bus 714 for storing information and instructions. An optional display device 710 is coupled to bus 714 of system 700 for displaying video and/or graphics.

As noted above with reference to exemplary embodiments thereof, the present invention provides hybrid clock distribution. The method and system provides for determining the block layout of an integrated circuit which employs a clock distribution network for distributing clock signals. In addition the method includes providing a mesh distribution network for delivering clock signals to integrated circuit blocks of the integrated circuit. Thereafter, a balanced tree distribution network for delivering clock signals to the components of each block of the integrated circuit is provided.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method for providing hybrid clock distribution comprising:
   determining the block layout of an integrated circuit which comprises a plurality of blocks and chip level components;
   using a mesh distribution network for delivering clock signals to blocks of said integrated circuit; and
   using a balanced tree distribution network for delivering clock signals to components of each block wherein said hybrid clock distribution comprises clock signals delivered by both said mesh distribution network and said balanced tree distribution network.

2. The method of claim 1, wherein said determining the block layout comprises determining the number and size of said plurality of circuit blocks.

3. The method of claim 2, wherein said determining the block layout further comprises determining a respective clock insertion point for each block of said plurality of integrated circuit blocks.

4. The method of claim 3, wherein said mesh distribution network comprises a minimum number of grids needed to distribute the clock signal to the plurality of integrated circuit blocks.

5. The method of claim 3, wherein said using a mesh distribution network manages skew at a chip level that is determined by computing the difference between maximum and minimum insertion delay of said plurality of blocks.

6. The method of claim 1, further comprising using automated tool support to implement said balanced tree network in each block wherein said balanced tree network distributes a clock signal with a skew defined by subtracting the skew at the chip level from a predetermined total skew budget.

7. The method of claim 1, wherein said using a mesh distribution network comprises:
   receiving a clock signal into said mesh distribution network;
   balancing clock edges of the clock signal with chip level buffers placed on the periphery of the mesh distribution network; and
   distributing the balanced clock edges to the plurality of blocks; and wherein said using said balanced tree distribution network comprises:
   receiving the clock edges distributed to the integrated circuit blocks into respective balanced tree clock distribution networks;
   balancing the clock edges with block level buffers located in the balanced tree clock distribution networks; and
   distributing the balanced clock edges to cells of each block.

8. A computer useable medium having computer useable code embodied therein causing a computer to perform operations comprising:
   determining the block layout of an integrated circuit which comprises a plurality of blocks and chip level components;
   using a mesh distribution network for delivering clock signals to blocks of said integrated circuit; and
   using a balanced tree distribution network for delivering clock signals to components of each block wherein said hybrid clock distribution comprises said clock signals delivered by said mesh distribution network and said balanced tree distribution network.

9. The medium of claim 8, wherein said determining the block layout comprises determining the number and size of said plurality of circuit blocks.

10. The medium of claim 9, wherein said determining the block layout further comprises determining a respective clock insertion point for each block of said plurality of integrated circuit blocks.

11. The medium of claim 10, wherein said mesh distribution network comprises a minimum number of grids needed to distribute the clock signal to the plurality of integrated circuit blocks.

12. The medium of claim 11, wherein said using a mesh distribution network manages skew at a chip level that is determined by computing the difference between maximum and minimum insertion delay of said plurality of blocks.

13. The medium of claim 8, further comprising using automated tool support to implement said balanced tree network in each block wherein said balanced tree network distributes a clock signal with a skew defined by subtracting the skew at the chip level from a predetermined total skew budget.

14. The medium of claim 8, wherein said using a mesh distribution network comprises:
receiving a clock signal into said mesh distribution network;
balancing clock edges of the clock signal with chip level buffers placed on the periphery of the mesh distribution network; and
distributing the balanced clock edges to the plurality of blocks; and wherein said using said balanced tree distribution network comprises:
receiving the clock edges distributed to the integrated circuit blocks into respective balanced tree clock distribution networks;
balancing the clock edges with block level buffers located in the balanced tree clock distribution networks; and
distributing the balanced clock edges to cells of each block.

15. A circuit including a hybrid clock distribution network comprising:
a block layout of an integrated circuit which comprises a plurality of integrated circuit blocks and chip level components;
a mesh distribution network for delivering clock signals to said plurality of blocks of said integrated circuit; and
respective balanced tree distribution networks located in said plurality of blocks for delivering clock signals to components of each block wherein said hybrid clock distribution comprises said clock signals delivered by said mesh distribution network and said balanced tree distribution network.

16. The circuit of claim 15, wherein the plurality of blocks individually comprise component circuits of the integrated circuit.

17. The circuit of claim 16, wherein each block of said plurality of blocks of the integrated circuit comprises a clock insertion point for coupling said mesh distribution network.

18. The circuit of claim 17, wherein said mesh distribution network comprises a minimum number of grids needed to distribute the clock signal to the plurality of blocks.

19. The circuit of claim 18, wherein skew exhibited at the chip level is determined by subtracting maximum insertion point delay from minimum insertion point delay.

20. The circuit of claim 15, wherein tool support is used to implement a respective balanced tree distribution network in each block wherein skew exhibited at the chip level is subtracted from a total skew budget to determine the skew allocable to the block level which is used in said respective balanced tree distribution network.

* * * * *